United States Patent
Kang et al.

(10) Patent No.: US 12,000,900 B2
(45) Date of Patent: Jun. 4, 2024

(54) APPARATUS AND METHOD FOR CONTROLLING TURN-ON OPERATION OF SWITCH UNITS INCLUDED IN PARALLEL MULTI-BATTERY PACK

(71) Applicant: LG ENERGY SOLUTION, LTD., Seoul (KR)

(72) Inventors: Su-Won Kang, Daejeon (KR); Han-Sol Kim, Daejeon (KR); Bum-Hee Lee, Daejeon (KR); Sang-Ki Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 493 days.

(21) Appl. No.: 17/435,188

(22) PCT Filed: Oct. 15, 2020

(86) PCT No.: PCT/KR2020/014113
§ 371 (c)(1),
(2) Date: Aug. 31, 2021

(87) PCT Pub. No.: WO2021/080247
PCT Pub. Date: Apr. 29, 2021

(65) Prior Publication Data
US 2022/0146586 A1    May 12, 2022

(30) Foreign Application Priority Data
Oct. 22, 2019    (KR) .......................... 10-2019-0131695

(51) Int. Cl.
*H02J 7/00*    (2006.01)
*G01R 31/3842*    (2019.01)
(Continued)

(52) U.S. Cl.
CPC ....... *G01R 31/3842* (2019.01); *G01R 31/396* (2019.01); *B60L 58/22* (2019.02)

(58) Field of Classification Search
None
See application file for complete search history.

(56) References Cited

U.S. PATENT DOCUMENTS 6,060,697 A    5/2000  Morita et al.
9,438,061 B2 *  9/2016  Takeyama ........... H02J 7/00712
(Continued)

FOREIGN PATENT DOCUMENTS

CN    102137772 A    7/2011
EP    1 837 944 A2    9/2007
(Continued)

OTHER PUBLICATIONS

International Search Report for PCT/KR2020/014113 dated Jan. 27, 2021.
(Continued)

*Primary Examiner* — Richard Isla
*Assistant Examiner* — Javier A. Bernal Sosa
(74) *Attorney, Agent, or Firm* — Birch, Stewart, Kolasch & Birch, LLP

(57) ABSTRACT

Disclosed is an apparatus and method for controlling a turn-on sequence of switches included in a parallel multi battery pack, including a processor that receives a switch voltage value from a voltage sensor coupled to a $k^{th}$ sequence switch unit (k is a turn-on sequence index, which is a natural number of 2 to n) before turning on the $k^{th}$ sequence switch, then turns on the $k^{th}$ sequence switch, subsequently receives a switch current value from a current sensor connected to the $k^{th}$ sequence switch, counts a watt energy value consumed in the $k^{th}$ sequence switch from the switch voltage value and the switch current value and (Continued)

determines the turn-on sequence of the first to $n^{th}$ switches in descending order from a switch having a greatest watt energy count value.

14 Claims, 5 Drawing Sheets

(51) Int. Cl.
    *G01R 31/396*     (2019.01)
    *B60L 58/22*     (2019.01)

(56) References Cited

U.S. PATENT DOCUMENTS

| | | | |
|---|---|---|---|
| 2010/0133914 A1* | 6/2010 | Kang | H01H 33/59 |
| | | | 307/115 |
| 2014/0002003 A1 | 1/2014 | Kim | |
| 2015/0194707 A1 | 7/2015 | Park | |

FOREIGN PATENT DOCUMENTS

| | | |
|---|---|---|
| EP | 2 372 867 A1 | 10/2011 |
| JP | 11-136860 A | 5/1999 |
| JP | 2000-312442 A | 11/2000 |
| JP | 2003-164001 A | 6/2003 |
| JP | 3526184 B2 | 5/2004 |
| JP | 2009-284606 A | 12/2009 |
| KR | 20-2000-0009697 U | 6/2000 |
| KR | 10-2014-0003201 A | 1/2014 |
| KR | 10-2015-0081731 A | 7/2015 |
| KR | 10-2016-0038239 A | 4/2016 |
| WO | WO 2012/043723 A1 | 4/2012 |

OTHER PUBLICATIONS

Extended European Search Report Application No. 20878281.3 dated Jul. 7, 2022.

\* cited by examiner

FIG. 6
|  | Pcak 1 | pack 2 | Pcak 3 | pack 4 | Pcak 5 |
|---|---|---|---|---|---|
| $p^{th}$ | 5kWh | 10kWh | 15kWh | 20kWh | 25kWh |
| $p+10^{th}$ | 35kWh | 40kWh | 30kWh | 25kWh | 28kWh |
| $p+20^{th}$ | 40kWh | 45kWh | 35kWh | 50kWh | 52kWh |
FIG. 7
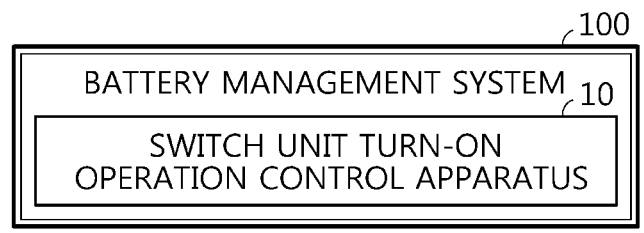
FIG. 8
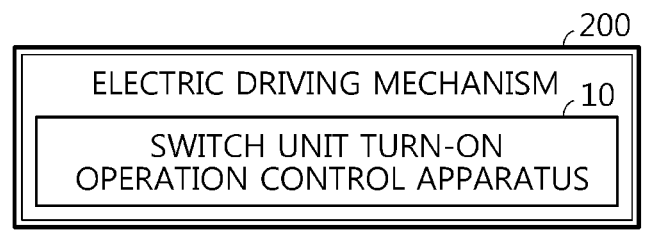

APPARATUS AND METHOD FOR CONTROLLING TURN-ON OPERATION OF SWITCH UNITS INCLUDED IN PARALLEL MULTI-BATTERY PACK

TECHNICAL FIELD

The present disclosure relates to a turn-on operation control apparatus and method of a switch unit, and more particularly, to an apparatus and method for controlling a turn-on sequence of switch units respectively included in battery packs of a parallel multi battery pack in which a plurality of battery packs are connected in parallel.

The present application claims priority to Korean Patent Application No. 10-2019-0131695 filed on Oct. 22, 2019 in the Republic of Korea, the disclosures of which are incorporated herein by reference.

BACKGROUND ART

The application field of batteries is gradually increasing not only to mobile devices such as cellular phones, laptop computers, smart phones and smart pads, but also to electric-driven vehicles (EVs, HEVs, PHEVs), large-capacity energy storage systems (ESS), or the like.

A battery system mounted to an electric vehicle includes a plurality of battery packs connected in parallel to secure a high energy capacity, and each battery pack includes a plurality of battery cells connected in series. Hereinafter, the plurality of battery packs connected in parallel will be referred to as a parallel multi battery pack.

In this specification, the battery cell may include one unit cell or a plurality of unit cells connected in parallel. The unit cell refers to one independent cell that has a negative electrode terminal and a positive electrode terminal and is physically separable. For example, one pouch-type lithium polymer cell may be regarded as a unit cell.

When the parallel multi battery pack is charged or discharged, all battery packs may be discharged or charged, or only some battery packs may be charged or discharged. The case where only some battery pack(s) are charged or discharged may happen when a failure occurs in a specific battery pack, when only some battery packs are charged or discharged for pack balancing, or when it is not necessary to operate all battery packs since the required discharging or charging power is small.

In order to control such selective discharging or charging, each battery pack of the parallel multi battery pack includes a switch unit therein. The switch unit functions to connect or disconnect the battery pack to/from a load or charger.

While the battery packs included in the parallel multi battery pack are being charged or discharged simultaneously, the voltages applied to external terminals of each battery pack are all the same.

However, if charging or discharging of the parallel multi battery pack is stopped to come into a no-load state, the voltage of each battery pack is stabilized to an equilibrium state voltage. Since the equilibrium state voltage varies depending on the degree of degradation (DOD) or the state of charge (SOC) of the battery pack, if the no-load state is maintained for a predetermined time, a deviation occurs between the voltages of the battery packs.

Meanwhile, when the parallel multi battery pack is connected again to the load or charger after the no-load state is maintained for a predetermined time, first, the switch unit included in each battery pack is controlled to a turn-on state. Then, the plurality of battery packs are connected in parallel.

In this state, if an external switch unit of the parallel multi battery pack is turned on, charging or discharging of the parallel multi battery pack is initiated.

Meanwhile, if the plurality of battery packs are connected in parallel before the external switch unit is turned on, current flows from a battery pack having a relatively high voltage to a battery pack having a relatively low voltage for a short time. The current flowing between battery packs while a plurality of battery packs are being connected in parallel is called an in-rush current.

The in-rush current flows for a short time and is large, thereby causing damage to the switch unit. In particular, if the switch unit is made of a mechanical switch such as a relay switch, the in-rush current causes a spark between contact points, thereby causing a short or open fault in the contact points.

The short fault occurs when the contact points are melted and fixed to each other, and the open fault occurs when the contact points are melted and completely separated so as not to be contacted even in a turn-on state. In addition, even if a short or open fault does not occur, when damage applied to the switch unit due to the in-rush current is accumulated, the resistance between the contact points increases, thereby causing heat generation of the switch unit.

In the parallel multi-battery pack, the in-rush current is unavoidable. This is because the voltage between the battery packs changes while the no-load state is maintained, unless the SOCs of the battery packs are perfectly balanced. Also, one of the important causes is that the turn-on timings of the switch units are not completely coincident. Therefore, if there is a voltage difference between a battery pack that will be connected in parallel later and a battery pack that is already connected in parallel, the in-rush current flows into the battery pack that will be connected in parallel later or the in-rush current flows out of the corresponding battery pack.

Therefore, apart from balancing the SOCs of battery packs, there is a need for a technology capable of mitigating the failure or deterioration of the switch unit caused by the in-rush current.

DISCLOSURE

Technical Problem

The present disclosure is designed to solve the problems of the related art, and therefore the present disclosure is directed to providing an apparatus and method capable of optimally controlling a turn-on sequence of switch units to mitigate damage to the switch units by an in-rush current flowing between battery packs while a plurality of battery packs are being connected in parallel before charging or discharging of a parallel multi-battery pack is initiated.

Technical Solution

In one aspect of the present disclosure, there is provided a turn-on operation control apparatus of a switch included in a parallel multi battery pack, which controls a turn-on operation of switches included in first to $n^{th}$ battery packs connected in parallel through a parallel link node.

Preferably, the control apparatus according to the present disclosure may comprise first to $n^{th}$ switches respectively installed on power lines of the first to $n^{th}$ battery packs; first to $n^{th}$ current sensors connected to the switches respectively installed on the power lines of the first to $n^{th}$ battery packs to measure currents flowing through the corresponding switches; first to $n^{th}$ voltage sensors respectively coupled to the first to $n^{th}$ switches to measure both-end voltages of the corresponding switches; and a processor operatively coupled to the first to $n^{th}$ switches, the first to $n^{th}$ current sensors and the first to $n^{th}$ voltage sensors.

Preferably, the processor may be configured to connect the first to $n^{th}$ battery packs in parallel by turning on the first to $n^{th}$ switches according to a preset turn-on sequence before charging or discharging of the parallel multi battery pack is initiated, receive a switch voltage value from a voltage sensor coupled to a $k^{th}$ sequence switch (k is a turn-on sequence index, which is a natural number of 2 to n) before turning on the $k^{th}$ sequence switch, then turn on the $k^{th}$ sequence switch, subsequently receive a switch current value from a current sensor connected to the $k^{th}$ sequence switch, and count a watt energy value consumed in the $k^{th}$ sequence switch from the switch voltage value and the switch current value.

Preferably, the processor may be configured to determine the turn-on sequence of the first to $n^{th}$ switches in descending order from a switch having a greatest watt energy count value by referring to watt energy count values respectively corresponding to the first to $n^{th}$ switches before charging or discharging of the parallel multi battery pack is initiated.

In the present disclosure, each of the first to $n^{th}$ switches may include a high-potential switch and a low-potential switch.

In this case, the processor may be configured to receive a switch voltage value from a voltage sensor coupled to the high-potential switch included in the $k^{th}$ sequence switch (k is a turn-on sequence index, which is a natural number of 2 to n) before turning on the $k^{th}$ sequence switch, and then turn on the $k^{th}$ sequence switch.

In addition, the processor may be configured to receive a switch current value from a current sensor connected to the high-potential switch included in the $k^{th}$ sequence switch, and count a watt energy value consumed in the $k^{th}$ sequence switch from the switch voltage value and the switch current value.

In an aspect, the control apparatus according to the present disclosure may further comprise a memory in which the switch voltage values and the switch current values of the first to $n^{th}$ switches and the watt energy count values consumed in the first to $n^{th}$ switches are recorded.

In another aspect, the control apparatus according to the present disclosure may further comprise a memory in which the switch voltage values of the high-potential switches respectively included in the first to $n^{th}$ switches, the switch current values flowing through the high-potential switches respectively included in the first to $n^{th}$ switches and the watt energy count values consumed in the first to $n^{th}$ switches are recorded.

Preferably, the processor may be configured to determine the turn-on sequence of the first to $n^{th}$ switches in descending order from a switch having the greatest watt energy count value by referring to the watt energy count values respectively corresponding to the first to $n^{th}$ switches before charging or discharging of the parallel multi battery pack is initiated.

Preferably, the first to $n^{th}$ switches may be relay switches.

In another aspect of the present disclosure, there is also provided a battery management system or an electric driving mechanism, which comprises the turn-on operation control apparatus of a switch included in a parallel multi battery pack.

In another aspect of the present disclosure, there is also provided a turn-on operation control method of a switch included in a parallel multi battery pack, which controls a turn-on operation of switches included in first to $n^{th}$ battery packs connected in parallel through a parallel link node.

Preferably, the method according to the present disclosure comprises (a) providing first to $n^{th}$ switches respectively installed on power lines of the first to $n^{th}$ battery packs; first to $n^{th}$ current sensors connected to the switches respectively installed on the power lines of the first to $n^{th}$ battery packs to measure currents flowing through the corresponding switches; and first to $n^{th}$ voltage sensors respectively coupled to the first to $n^{th}$ switches to measure both-end voltages of the corresponding switches; and (b) connecting the first to $n^{th}$ battery packs in parallel by turning on the first to $n^{th}$ switches according to a preset turn-on sequence before charging or discharging of the parallel multi battery pack is initiated, receiving a switch voltage value from a voltage sensor coupled to a $k^{th}$ sequence switch (k is a turn-on sequence index, which is a natural number of 2 to n) before turning on the $k^{th}$ sequence switch, then turning on the kth sequence switch, subsequently receiving a switch current value from a current sensor connected to the $k^{th}$ sequence switch, and counting and storing a watt energy value consumed in the $k^{th}$ sequence switch from the switch voltage value and the switch current value.

Preferably, in the method according to the present disclosure, the turn-on sequence of the first to $n^{th}$ switches may be determined in descending order from a switch having the greatest watt energy count value by referring to watt energy count values respectively corresponding to the first to $n^{th}$ switches before charging or discharging of the parallel multi battery pack is initiated.

Preferably, each of the first to $n^{th}$ switches may include a high-potential switch and a low-potential switch.

In this case, in the step (b), a switch voltage value may be received from a voltage sensor coupled to the high-potential switch included in the $k^{th}$ sequence switch (k is a turn-on sequence index, which is a natural number of 2 to n) before turning on the $k^{th}$ sequence switch, and then the $k^{th}$ sequence switch may be turned on.

In addition, in the step (b), a switch current value may be received from a current sensor connected to the high-potential switch included in the $k^{th}$ sequence switch, and a watt energy value consumed in the $k^{th}$ sequence switch may be counted from the switch voltage value and the switch current value.

In an aspect, the method according to the present disclosure may further comprise storing the switch voltage values and the switch current values of the first to $n^{th}$ switches and the watt energy count values consumed in the first to $n^{th}$ switches.

In another aspect, the method according to the present disclosure may further comprise storing the switch voltage values of the high-potential switches respectively included in the first to $n^{th}$ switches, the switch current values flowing through the high-potential switches respectively included in the first to $n^{th}$ switches and the watt energy count values consumed in the first to $n^{th}$ switches.

According to the present disclosure, in the step (b), the turn-on sequence of the first to $n^{th}$ switches may be determined in descending order from a switch having a greatest watt energy count value by referring to the stored watt energy count values respectively corresponding to the first to $n^{th}$ switches before charging or discharging of the parallel multi battery pack is initiated.

Advantageous Effects

According to the present disclosure, by optimally controlling a turn-on sequence of switch units included in battery packs of the parallel multi battery pack, it is possible to minimize damage to the switch units by an in-rush current while a plurality of battery packs are being connected in parallel before charging or discharging of the parallel multi-battery pack is initiated. Therefore, it is possible to reduce the replacement cost caused by failure of the switch units by increasing the life of the switch units.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

FIG. 6 is a table showing a watt energy count value consumed in the switch unit included in each battery pack based on $p^{th}$, $p+10^{th}$ and $p+20^{th}$ parallel connection timings when the switch unit included in the parallel multi battery pack where five battery packs are connected in parallel is controlled to turn on according to an embodiment of the present disclosure.

FIG. 7 is a block diagram showing a battery management system including the turn-on operation control apparatus of the switch unit according to an embodiment of the present disclosure.

FIG. 8 is a block diagram showing an electric driving mechanism including the turn-on operation control apparatus of the switch unit according to an embodiment of the present disclosure.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the scope of the disclosure.

In the embodiments described below, a battery cell refers to a lithium secondary battery. Here, the lithium secondary battery collectively refers to a secondary battery in which lithium ions act as operating ions during charging and discharging to cause an electrochemical reaction at a positive electrode and a negative electrode.

Meanwhile, even if the name of the secondary battery changes depending on the type of electrolyte or separator used in the lithium secondary battery, the type of packaging material used to package the secondary battery, and the interior or exterior structure of the lithium secondary battery, as long as lithium ions are used as operating ions the secondary battery should be interpreted as being included in the category of the lithium secondary battery.

The present disclosure may also be applied to other secondary batteries other than the lithium secondary battery. Therefore, even if the operating ions are not lithium ions, any secondary battery to which the technical idea of the present disclosure may be applied should be interpreted as being included in the category of the present disclosure regardless of its type.

In addition, it should be noted in advance that the battery cell may refer to one unit cell or a plurality of unit cells connected in parallel.

Figure 1:
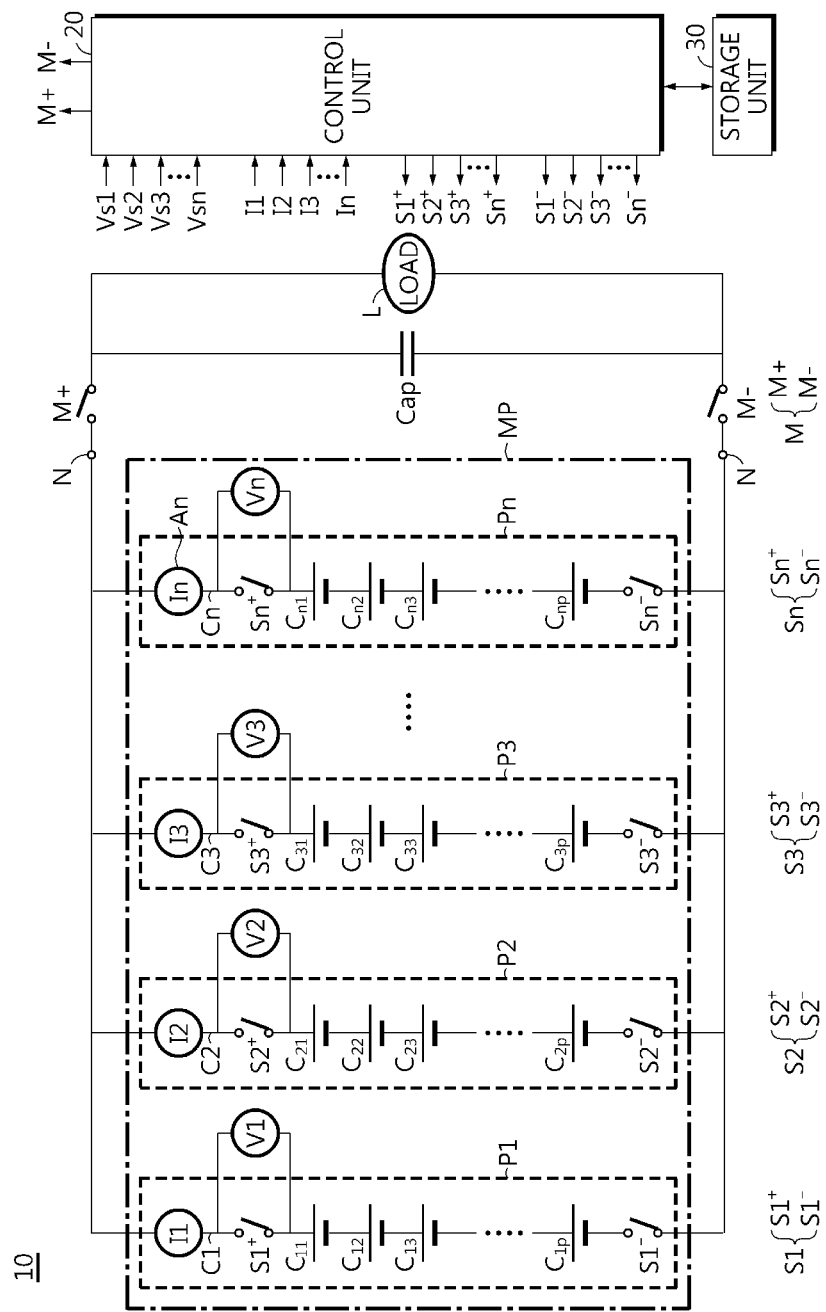
FIG. 1 is a block diagram showing a turn-on operation control apparatus of a switch unit included in a parallel multi battery pack according to an embodiment of the present disclosure.

FIG. 1 is a block diagram showing a configuration of a turn-on operation control apparatus of a switch unit included in a parallel multi battery pack according to an embodiment of the present disclosure.

Referring to FIG. 1, a turn-on operation control apparatus 10 of a switch unit according to an embodiment of the present disclosure is a device that controls a turn-on operation of first to $n^{th}$ switch units S1 to Sn used to connect first to $n^{th}$ battery packs P1 to Pn in parallel through a parallel link node N.

Hereinafter, a parallel multi battery pack MP is defined as a battery module including the first to $n^{th}$ battery packs P1 to Pn connected in parallel through the first to $n^{th}$ switch units S1 to Sn.

The parallel multi battery pack MP may be connected to a load L through an external switch unit M. The external switch unit M includes an external high-potential switch M+ and an external low-potential switch M−. The external high-potential switch M+ and the external low-potential switch M− may be relay switches, but the present disclosure is not limited thereto.

The load L is a device that receives power from the parallel multi battery pack MP, and may be an inverter included in an electric vehicle as an example. The inverter is a power conversion circuit that is installed at a front end of an electric motor of an electric vehicle to convert a DC current supplied from the parallel multi battery pack MP into a 3-phase AC current and supplies the 3-phase AC current to the electric motor. The type of the load L is not limited to the inverter, and any device or instrument capable of receiving power from the parallel multi battery pack MP may be included in the category of the load L regardless of its type. In addition, it is obvious that the parallel multi battery pack MP may be connected to a charger other than the load L.

If the external high-potential switch M+ and external low-potential switch M− are turned on, the parallel multi battery pack MP is electrically connected to the load L. Conversely, if the external high-potential switch M+ and the external low-potential switch M− are turned off, the electrical connection between the parallel multi battery pack MP and the load L is released.

Each of the first to $n^{th}$ battery packs P1 to Pn includes a plurality of battery cells connected in series therein. That is, the first battery pack P1 includes first to $p^{th}$ battery cells $C_{11}$ to $C_{1p}$ connected in series. In addition, the second battery pack P2 includes first to $p^{th}$ battery cells $C_{21}$ to $C_{2p}$ connected in series. In addition, the third battery pack P3 includes first to $p^{th}$ battery cells $C_{31}$ to $C_{3p}$ connected in series. In addition, the $n^{th}$ battery pack Pn includes first to $p^{th}$ battery cells $C_{n1}$ to $C_{np}$ connected in series. Though fourth to n−$1^{th}$ battery packs are not shown in the drawing, each of the fourth to n−$1^{th}$ battery packs includes a p number of battery cells connected in series in the same manner as the illustrated battery packs.

Each of the first to $n^{th}$ battery packs P1 to Pn includes the switch units S1 to Sn therein. That is, the first battery pack P1 includes a first switch unit S1. In addition, the second battery pack P2 includes a second switch unit S2. In addition, the third battery pack P3 includes a third switch unit S3. In addition, the $n^{th}$ battery pack Pn includes an $n^{th}$ switch unit Sn. Though the fourth to n−$1^{th}$ battery packs are not shown in the drawing, each of the fourth to n−$1^{th}$ battery packs includes a switch unit in the same manner as the illustrated battery packs.

Each of the first to $n^{th}$ switch units S1 to Sn includes a low-potential switch and a high-potential switch. That is, the first switch unit S1 includes a first high-potential switch S1$^+$ installed at a high-potential side of the first battery pack P1 and a first low-potential switch S1$^-$ installed at a low-potential side of the first battery pack P1. In addition, the second switch unit S2 includes a second high-potential switch S2$^+$ installed at a high-potential side of the second battery pack P2 and a second low-potential switch S2$^-$ installed at a low-potential side of the second battery pack P2. In addition, the third switch unit S3 includes a third high-potential switch S3$^+$ installed at a high-potential side of the third battery pack P3 and a third low-potential switch S3$^-$ installed at a low-potential side of the third battery pack P3. In addition, the $n^{th}$ switch unit Sn includes an $n^{th}$ high-potential switch Sn$^+$ installed at a high-potential side of the $n^{th}$ battery pack Pn and an $n^{th}$ low-potential switch Sn$^-$ installed at a low-potential side of the $n^{th}$ battery pack Pn. Meanwhile, though the fourth to n−$1^{th}$ battery packs are not shown in the drawing, each of the fourth to n−$1^{th}$ battery packs includes a high-potential switch and a low-potential switch in the same manner as the illustrated battery pack. In addition, in each switch unit, any one of the high-potential switch and the low-potential switch may be omitted.

In the following disclosure, when the switch unit is turned on, the low-potential switch may be turned on first and the high-potential switch may be turned on later. Also, when the switch unit is turned off, the high-potential switch may be turned off first and the low-potential switch may be turned off later.

A switch employed at the switch units S1 to Sn may be a semiconductor switch such as a MOSFET or a mechanical switch such as a relay, but the present disclosure is not limited thereto.

A capacitor Cap is provided at a front end of the load L. The capacitor Cap is connected in parallel between the parallel multi battery pack MP and the load L. The capacitor Cap functions as a filter to prevent a noise current from being applied toward the load L.

The turn-on operation control apparatus 10 of the switch units S1 to Sn according to the present disclosure includes first to $n^{th}$ current sensors I1 to In.

The first to $n^{th}$ current sensors I1 to In are installed on power lines C1 to Cn connected to the first to $n^{th}$ battery packs P1 to Pn, respectively, to measure a switch current value flowing through the switch unit, especially the high-potential switch.

That is, the first current sensor I1 measures a switch current value flowing through the first high-potential switch S1$^+$ of the first switch unit S1 included in the first battery pack P1. In addition, the second current sensor I2 measures a switch current value flowing through the second high-potential switch S2$^+$ of the second switch unit S2 included in the second battery pack P2. In addition, the third current sensor I3 measures a switch current value flowing through the third high-potential switch S3$^+$ of the third switch unit S3 included in the third battery pack P3. The $n^{th}$ current sensor In measures a switch current value flowing through the $n^{th}$ high-potential switch Sn$^+$ of the $n^{th}$ switch unit Sn included in the $n^{th}$ battery pack Pn. Although not shown in the drawing, the fourth to n−$1^{th}$ current sensor measure switch current values flowing through the high-potential switches of the fourth to n−$1^{th}$ switch units included in the fourth to n−$1^{th}$ battery packs, respectively. In the drawing, it is shown that first to $n^{th}$ current sensors I1 to In are included in the battery packs, respectively. However, in the present disclosure, the first to $n^{th}$ current sensors I1 to In may also be installed outside the battery packs, without limitation.

The first to $n^{th}$ current sensors I1 to In may be Hall sensors. The Hall sensor is a known current sensor that outputs a voltage signal corresponding to the magnitude of a current. In another example, the first to $n^{th}$ current sensors I1 to In may be sense resistors. If the voltage applied to both ends of the sense resistor is measured, the magnitude of current flowing through the sense resistor may be determined using Ohm's law. In other words, if the magnitude of the measured voltage is divided by a known resistance value of the sense resistor, the magnitude of current flowing through the sense resistor may be determined.

The turn-on operation control apparatus 10 of the switch units S1 to Sn according to the present disclosure includes first to $n^{th}$ voltage sensors V1 to Vn. The first voltage sensor V1 measures a switch voltage value Vs1 applied to both ends of the first high-potential switch S1$^+$ included in the first switch unit S1. The switch voltage value Vs1 corresponds to a difference between a positive electrode voltage of a cell $C_{11}$ having a highest potential among the cells of the battery pack P1 including the first switch unit S1 and a voltage applied to the parallel link node N. The second voltage sensor V2 measures a switch voltage value Vs2 applied to both ends of the second high-potential switch S2$^+$ included in the second switch unit S2. The switch voltage value Vs2 corresponds to a difference between a positive electrode voltage of a cell $C_{21}$ having a highest potential among the cells of the battery pack P2 including the second switch unit S2 and the voltage applied to the parallel link node N. The third voltage sensor V3 measures a switch voltage value Vs3 applied to both ends of the third high-potential switch S3$^+$ included in the third switch unit S3. The switch voltage value Vs3 corresponds to a difference between a positive electrode voltage of a cell $C_{31}$ having a highest potential among the cells of the battery pack P3 including the third switch unit S3 and the voltage applied to the parallel link node N. The $n^{th}$ voltage sensor Vn measures a switch voltage value Vsn applied to both ends of the $n^{th}$ high-potential switch Sn$^+$ included in the $n^{th}$ switch unit Sn. The switch voltage value (Vsn) corresponds to a difference between a positive electrode voltage of a cell $C_{n1}$ having a highest potential among the cells of the battery pack Pn including the $n^{th}$ switch unit Sn and the voltage applied to the parallel link node N. Although not shown in the drawing, the fourth to n−$1^{th}$ voltage sensors measure both-end voltages of the fourth to n−$1^{th}$ high-potential switches included in the fourth to n−$1^{th}$ switch units, respectively.

The first to $n^{th}$ voltage sensors V1 to Vn include a voltage measurement circuit such as a differential amplifier circuit.

Since the voltage measurement circuit is well known in the art, the voltage measurement circuit will not be described in detail here.

The turn-on operation control apparatus 10 of the switch units S1 to Sn according to the present disclosure includes a control unit 20 operatively coupled to the first to $n^{th}$ switch units S1 to Sn, the first to $n^{th}$ current sensors I1 to In, and the first to $n^{th}$ voltage sensors V1 to Vn.

The control unit 20 connects the first to $n^{th}$ battery packs P1 to Pn in parallel before the parallel multi battery pack MP is charged or discharged, and then turns on the external switch unit M.

When connecting the first to $n^{th}$ battery packs P1 to Pn in parallel, the control unit 20 controls a turn-on sequence of the first to $n^{th}$ switch units S1 to Sn to minimize damage to the switch units by an in-rush current.

Specifically, when the first to $n^{th}$ switch units S1 to Sn are turned on, the control unit 20 counts an energy consumption by the in-rush current flowing through the switch unit for management.

Here, the energy consumption refers to a watt energy consumed through the high-potential switch while the in-rush current suddenly flows through the high-potential switch, when the high-potential switch and the low-potential switch of the switch unit are turned on in a state where there is a voltage difference between both ends of the high-potential switch included in the switch unit.

The voltage difference between both ends of the high-potential switch is generated when the battery pack including the high-potential switch is connected in parallel with another battery pack.

For example, it is assumed that the second switch unit S2 included in the second battery pack P2 is turned on after the first switch unit S1 included in the first battery pack P1 is turned on. In this case, there is no voltage difference between both ends of the high-potential switch of the first switch unit S1 included in the first battery pack P1 before the first switch unit S1 is turned on. However, before the second switch unit S2 is turned on, a voltage corresponding to the difference between the voltage of the first battery pack P1 and the voltage of the second battery pack P2 is applied to both ends of the second high-potential switch S2$^+$ included in the second switch unit S2.

As another example, it is assumed that the third switch unit S3 included in the third battery pack P3 is turned on after the first switch unit S1 included in the first battery pack P1 and the second switch unit S2 included in the second battery pack P2 are turned on. In this case, before the third switch unit S3 is turned on, a voltage corresponding to the difference between the voltage of the third battery pack P3 and the voltage of the parallel link node N connected in parallel with the first battery pack P1 and the second battery pack P2 is applied to both ends of the third high-potential switch S3$^+$ included in the third switch unit S3.

As another example, it is assumed that the $n^{th}$ switch unit Sn included in the $n^{th}$ battery pack Pn is turned on after the first switch unit S1 to the n-1$^{th}$ switch unit Sn-1 included in the first battery pack P1 to the n-1$^{th}$ battery pack are turned on. In this case, before the $n^{th}$ switch unit Sn is turned on, a voltage corresponding to the difference between the voltage of the $n^{th}$ battery pack Pn and the voltage of the parallel link node N connected to the first battery pack P1 to the n-1$^{th}$ battery pack Pn-1 in parallel is applied to both ends of the $n^{th}$ high-potential switch Sn$^+$ included in the $n^{th}$ switch unit Sn.

If the high-potential switch and the low-potential switch of the switch unit are turned on in a state where a voltage is applied to both ends of the high-potential switch of the switch unit, a current flows rapidly to the high-potential switch so that a watt energy corresponding to 'the both-end voltage of the high-potential switch·the current flowing through high-potential switch' is consumed per unit time. The consumption of watt energy occurs at a high-potential switch included in another battery pack when another battery pack is newly connected in parallel to the battery packs that are already connected in parallel. In addition, since the switch unit included in the battery pack already connected in parallel maintains the turn-on state, there is no energy consumption in the high-potential switch while another battery pack is newly connected.

In the case where the first to $n^{th}$ switch units are turned on according to a preset turn-on sequence, the control unit 20 may count the watt energy consumed at the high-potential switch when the high-potential switch of the battery pack connected in parallel in a $k^{th}$ sequence is turned on.

Specifically, before turning on a $k^{th}$ sequence switch unit (k is a turn-on sequence index, which is a natural number of 2 to n), the control unit 20 receives a switch voltage value from the voltage sensor coupled to the high-potential switch of the $k^{th}$ sequence switch unit and record the same in a storage unit 30. After that, the control unit 20 turns on the high-potential switch and the low-potential switch of the $k^{th}$ sequence switch unit, and then receives a switch current value flowing through the switch unit from the current sensor and records the same in the storage unit 30. Then, the control unit 20 calculates a watt energy value consumed in the high-potential switch of the $k^{th}$ sequence switch unit from the switch voltage value and the switch current value recorded in the storage unit 30. Subsequently, the control unit 20 updates the watt energy count value consumed in the high-potential switch of the $k^{th}$ sequence switch unit by using the calculated watt energy value. Here, the control unit 20 records and manages the watt energy count value in the storage unit 30.

The control unit 20 optimally determines the turn-on sequence of the first to $n^{th}$ switch units S1 to Sn by referring to the watt energy count value of each switch unit recorded in the storage unit 30, when connecting the plurality of battery packs in parallel before the parallel multi battery pack MP in a no-load state is charged or discharged.

Specifically, the control unit 20 may determine the turn-on sequence of the first to $n^{th}$ switch units S1 to Sn in descending order from a switch unit having a greatest watt energy count value by referring to the watt energy count value updated while the plurality of battery packs are connected in parallel.

In addition, when the control unit 20 connects the plurality of battery packs in parallel while turning on the switch units according to the determined turn-on sequence of first to $n^{th}$ switch units S1 to Sn and, as described above, it is possible to calculate the watt energy value consumed in the high-potential switch included in each switch unit and update the watt energy count value.

Meanwhile, when the plurality of battery packs are connected in parallel, a voltage is not applied to both ends of the high-potential switch included in the switch unit that is turned on for the first time. For example, when the first high-potential switch S1$^+$ included in the first switch unit S1 of the first battery pack P1 is turned on for the first time, the positive electrode potential of the highest cell $C_{11}$ among the cells included in the first battery pack P1 is applied only to a lower node of the first high-potential switch S1$^+$ and no potential is applied to an upper node of the first high-potential switch S1$^+$. Therefore, the control unit 20 may calculate the watt energy consumed in the high-potential switch of the switch unit that is turned on in the first order as 0, and the watt energy count value may be maintained as a previous value.

In the present disclosure, there is no particular limitation on the type of the storage unit 30 as long as it is a storage medium capable of recording and erasing information. As an example, the storage unit 30 may be a RAM, a ROM, an EEPROM, a register, or a flash memory. The storage unit 30 may also be electrically connected to the control unit 20 through, for example, a data bus so as to be accessed by the control unit 20.

The storage unit 30 also stores and/or updates and/or erases and/or transmits a program including various control logics performed by the control unit 20, and/or data generated when the control logic is executed. The storage unit 30 may be logically divided into two or more parts and may be included in the control unit 20 without limitation.

In the present disclosure, the control unit 20 may control the first to $n^{th}$ voltage sensors V1 to Vn, and receive signals Vs1 to Vsn representing the switch voltage values from the first to $n^{th}$ voltage sensors V1 to Vn and record the same in the storage unit 30. In addition, the control unit 20 may control the first to $n^{th}$ current sensors I1 to In, and receive signals I1 to In representing the switch current values from the first to $n^{th}$ current sensors I1 to In and record the same in the storage unit 30. Also, the control unit 20 may output signals $S1^+$ to $Sn^+$ and $S1^-$ to $Sn^-$, which are switch control signals for controlling the turn-on or turn-off operation of the switch units S1 to Sn included in each battery pack. Here, the $S1^+$ to $Sn^+$ signals are signals for independently controlling the high-potential switches of the first to $n^{th}$ switch units S1 to Sn, and the $S1^-$ to $Sn^-$ signals are signals for independently controlling the low-potential switches of the first to $n^{th}$ switch units S1 to Sn. Also, the control unit 20 may output signals M+ and M−, which are switch control signals for controlling the external high-potential switch M+ and the external low-potential switch M− of the external switch unit M.

In the present disclosure, the control unit 20 may optionally include a processor, an application-specific integrated circuit (ASIC), another chipset, a logic circuit, a register, a communication modem, a data processing device, or the like, known in the art to execute the various control logics described above. In addition, when the control logic is implemented in software, the control unit 20 may be implemented as a set of program modules. At this time, the program module may be stored in a memory and executed by a processor. The memory may be provided inside or outside the processor and be connected to the processor through various well-known computer components. Also, the memory may be included in the storage unit 30 of the present disclosure. In addition, the memory refers to a device in which information is stored, regardless of the type of device, and does not refer to a specific memory device.

In addition, one or more of the various control logics of the control unit 20 may be combined, and the combined control logics may be written in a computer-readable code system and recorded in a computer-readable recording medium. The recording medium is not particularly limited as long as it is accessible by a processor included in a computer. As an example, the storage medium includes at least one selected from the group consisting of a ROM, a RAM, a register, a CD-ROM, a magnetic tape, a hard disk, a floppy disk and an optical data recording device. The code scheme may be distributed to a networked computer to be stored and executed therein. In addition, functional programs, codes and code segments for implementing the combined control logics may be easily inferred by programmers in the art to which the present disclosure belongs.

The turn-on operation control apparatus 10 of the switch unit included in the parallel multi battery pack according to the present disclosure may be included in a battery management system 100 as shown in FIG. 7. The battery management system 100 controls the overall operation related to charging and discharging of a battery, and is a computing system called a battery management system (BMS) in the art.

In addition, the turn-on operation control apparatus 10 of the switch unit included in the parallel multi battery pack according to the present disclosure may be mounted to various types of electric driving mechanism 200 as shown in FIG. 8.

According to an embodiment, the electric driving mechanism 200 may be a mobile computer device such as a mobile phone, a laptop computer and a tablet computer, or a handheld multimedia device such as a digital camera, a video camera and an audio/video reproduction device.

According to another embodiment, the electric driving mechanism 200 may be an electric power device movable by electricity, such as an electric vehicle, a hybrid electric vehicle, an electric bicycle, an electric motorcycle, an electric train, an electric ship and an electric plane, or a power tool having a motor, such as an electric drill and an electric grinder.

Figure 2:
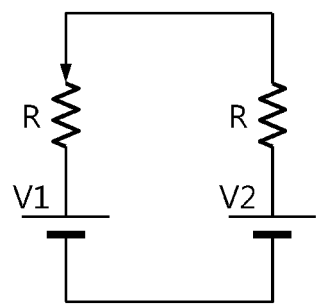
FIGS. 2 and 3 are diagrams for illustrating that the magnitude of an in-rush current varies according to a parallel connection timing while a plurality of battery packs are being connected in parallel before charging or discharging of the parallel multi battery pack is initiated.
Figure 3:
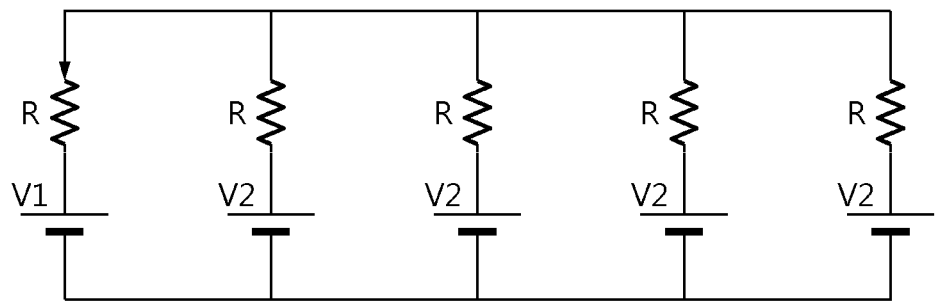

FIGS. 2 and 3 are diagrams for illustrating that the magnitude of an in-rush current varies according to a parallel connection timing while the plurality of battery packs P1 to Pn are being connected in parallel before charging or discharging of the parallel multi battery pack MP is initiated.

Referring to FIG. 2, if a left battery pack having a voltage of V1 (<V2) is connected to a right battery pack in which the voltage is V2 and the switch unit thereof maintains a turn-on state, there is a voltage difference corresponding to |V2−V1| between two battery packs. Therefore, when the switch unit included in the battery pack having the voltage V1 is turned on, an in-rush current flows from the right battery pack to the left battery pack. The magnitude of the in-rush current is |V2−V1|/2R. Here, R is an internal resistance value of the battery pack.

Referring to FIG. 3, if a first battery pack having a voltage of V1 (<V2) is connected to second to fifth battery packs (connected in parallel) in which the voltage is V2 and the switch unit thereof maintains a turn-on state, there is a voltage difference corresponding to |V2−V1| between the first battery pack and the battery packs connected in parallel. Therefore, when the switch unit included in the battery pack having the voltage V1 is turned on, an in-rush current flows from the second to fifth battery packs to the first battery pack. The magnitude of the in-rush current is (V2−V1)/(R+0.25R). Here, R is an internal resistance value of the battery pack.

The magnitude of the in-rush current in the example shown in FIG. 3 is larger than the magnitude of the in-rush current in the example shown in FIG. 2. Therefore, although not necessarily, it may be found that when the plurality of battery packs are connected in parallel, if the battery packs have the same internal resistance, the magnitude of the in-rush current may increase as the sequence of parallel connection is later.

Figure 4:
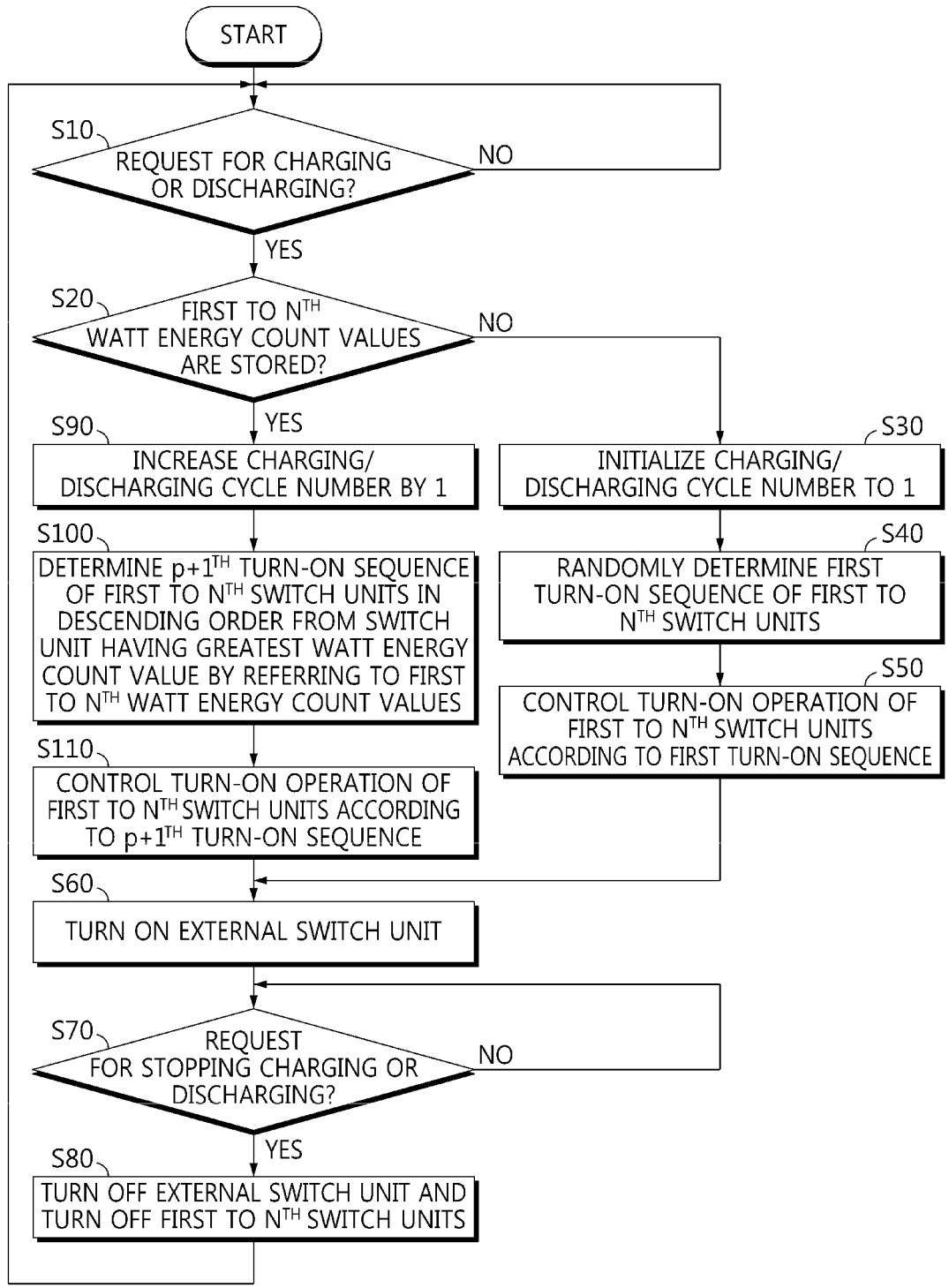
FIGS. 4 and 5 are flowcharts for illustrating a turn-on operation control method of the switch unit included in the parallel multi battery pack according to an embodiment of the present disclosure.
Figure 5:
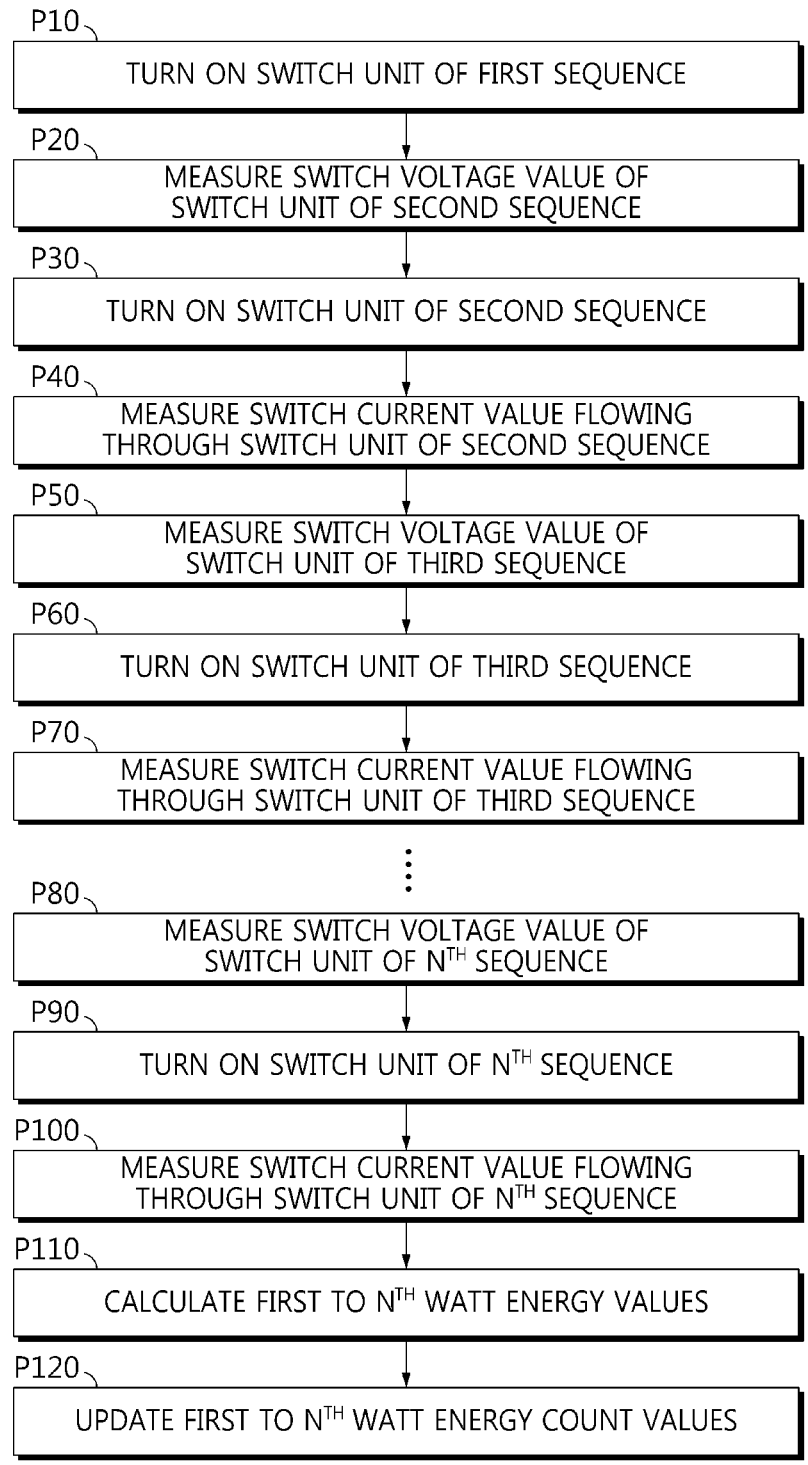

FIGS. 4 and 5 are flowcharts for illustrating a turn-on operation control method of the switch unit included in the parallel multi battery pack according to an embodiment of the present disclosure.

As shown in FIG. 4, the control unit 20 determines whether there is a request for charging or discharging the parallel multi battery pack MP in Step S10. To this end, the control unit 20 may be connected to a device that transmits a charge or discharge request through a communication interface. The device may be a control system that controls the operation of the load L or the charger. In one example, the charge or discharge request may be transmitted to the control unit 20 in the form of a communication message.

If the determination result of Step S10 is NO, the control unit 20 holds progression of the method. Meanwhile, if the determination result of Step S10 is YES, the control unit 20 determines whether the first to $n^{th}$ watt energy count values are stored in the storage unit 30 in Step 20.

Here, the first to $n^{th}$ watt energy count values are values obtained by counting the watt energy consumed in the high-potential switch whenever the high-potential switches of the first to $n^{th}$ switch units S1 to Sn respectively included in the first to $n^{th}$ battery packs P1 to Pn are turned on.

The first to $n^{th}$ watt energy count values may be updated in Step P10 to Step P110, explained later with reference to FIG. 5.

If the determination result of Step S20 is NO, the control unit 20 initializes a charging/discharging cycle number p to 1 in Step S30. p is an index for the charging/discharging cycle number. The charging/discharging cycle number refers to a charging or discharging cycle number of the parallel multi battery pack MP. If the charging/discharging cycle number is 1, it means the first charging and discharging. Step S40 proceeds after Step S30.

The control unit 20 randomly determines a first turn-on sequence of the first to $n^{th}$ switch units S1 to Sn, namely a first parallel connection sequence of the first to $n^{th}$ battery packs P1 to Pn in Step S40.

Alternatively, the control unit 20 may increase or decrease the turn-on sequence of the first to $n^{th}$ switch units S1 to Sn as the SOC is higher based on the SOCs of the first to $n^{th}$ battery packs P1 to Pn. However, the present disclosure is not limited thereto.

If the charging/discharging cycle number is 1, the watt energy count value consumed in the high-potential switch included in the switch unit is 0, so the turn-on sequence of the switch unit may be randomly determined. Step S50 proceeds after Step S40.

The control unit 20 controls the turn-on operation of first to $n^{th}$ switch units S1 to Sn according to the first turn-on sequence in Step S50. The control unit 20 updates the first to $n^{th}$ watt energy count values for the first to $n^{th}$ switch units S1 to Sn according to the flowchart shown in FIG. 5 while Step S50 is in progress and records the same in the storage unit 30.

Specifically, the control unit 20 turns on the switch unit of the first sequence in Step P10. Turning on the switch unit means that the high-potential switch and the low-potential switch are turned on, which will be applied to the following in the same way. Preferably, the control unit 20 first turns on the low-potential switch and then turns on the high-potential switch. Step P20 proceeds after Step P10.

Before controlling the turn-on operation of the switch unit of the second sequence, the control unit 20 measures the switch voltage value applied to both ends of the high-potential switch by controlling the voltage sensor coupled to the high-potential switch of the corresponding switch unit, and record the switch voltage value in the storage unit 30 in Step P30. Step P30 proceeds after Step P20.

The control unit 20 turns on the switch unit of the second sequence in Step P30. Subsequently, in Step P40, the control unit 20 measures the switch current value flowing through the high-potential switch by controlling the current sensor installed on the line where the switch unit of the second sequence is located, and records the switch current value in the storage unit 30. Step P50 proceeds after Step P40.

Before controlling the turn-on operation of the switch unit of the third sequence, in Step P50, the control unit 20 measures the switch voltage value applied to both ends of the high-potential switch by controlling the voltage sensor coupled to the high-potential switch of the corresponding switch unit, and records the switch voltage value in the storage unit 30. Step P60 proceeds after Step P50.

The control unit 20 turns on the switch unit of the third sequence in Step P60. Subsequently, in step P70, control unit 20 measures the switch current value flowing through the high-potential switch by controlling the current sensor installed on the line where the switch unit of the third sequence is located, and records the switch current value in the storage unit 30.

Steps P50 to P70 are applied equally to fourth to $n-1^{th}$ switch units, and then Step P80 proceeds.

Before controlling the turn-on operation for the switch unit of the $n^{th}$ sequence, in Step P80, the control unit 20 measures the switch voltage value applied to both ends of the high-potential switch by controlling the voltage sensor coupled to the high-potential switch of the corresponding switch unit, and records the switch voltage value in the storage unit 30. Step P90 proceeds after Step P80.

The control unit 20 turns on the switch unit of the $n^{th}$ sequence in Step P90. Subsequently, in Step P100, the control unit 20 measures the switch current value flowing through the high-potential switch by controlling the current sensor installed on the line where the switch unit of the $n^{th}$ sequence is located, and records the switch current value in the storage unit 30. Step P110 proceeds after Step P100.

The control unit 20 calculates the first to $n^{th}$ watt energy values consumed in the high-potential switches of the first to $n^{th}$ switch units S1 to Sn in Step P110 using the following equation. The standard time is 1 second to several seconds. Since voltage is not applied to both ends of the high-potential switch of the switch unit that is turned on for the first time, the watt energy for the firstly-turned on switch unit is 0. Step P120 proceeds after Step P110.

$$\text{watt energy} = V*I*t \text{ (} V \text{ is a switch voltage value, } I \text{ is a switch current value, } t \text{ is a standard time)} \quad \text{<Equation>}$$

The control unit 20 updates the first to $n^{th}$ watt energy count values for first to $n^{th}$ switch units S1 to Sn in Step P120. That is, the control unit 20 updates the first to $n^{th}$ watt energy count values by adding the first to $n^{th}$ watt energy values calculated in Step P110 to the previous first to $n^{th}$ watt energy count values recorded in the storage unit 30.

If the first to $n^{th}$ watt energy count values are completely updated while the turn-on operation of the first to $n^{th}$ switch units is controlled according to the first turn-on sequence through Steps P10 to P120, Step S60 proceeds.

The control unit 20 controls the external switch unit M of the parallel multi battery pack MP to a turn-on state in Step S60. Then, the first charging or discharging of the parallel multi battery pack MP is initiated. Step S70 proceeds after Step S60.

The control unit 20 determines whether it is required to stop charging or discharging of the parallel multi battery pack MP in Step S70. The request for stopping charging or discharging may be provided from a control system of the load L or the charger through a communication interface coupled to the control unit 20.

If the determination of Step S70 is NO, the control unit 20 maintains the turn-on state of the first to $n^{th}$ switch units S1 to Sn and the external switch unit M. Meanwhile, if the determination of Step S70 is YES, the control unit 20 turns off the external switch unit M and turns off the first to $n^{th}$ switch units S1 to Sn in Step S80 to stop charging or discharging of the parallel multi battery pack MP. The turn-off sequence of the first to $n^{th}$ switch units S1 to Sn is opposite to the turn-on sequence. After the first charging and discharging cycle is ended, the process proceeds to Step S10. Therefore, the control unit 20 comes into a mode of monitoring whether a charge or discharge request is provided from the control system of the load L or the charger.

Meanwhile, if the charging/discharging cycle number is 2 or above, the control unit 20 determines the turn-on sequence of the first to $n^{th}$ switch units S1 to Sn by referring to the first to $n^{th}$ watt energy count values recorded in the storage unit 30, and controls the turn-on operation of the first to $n^{th}$ switch units S1 to Sn, namely the parallel connection order of the first to $n^{th}$ battery packs P1 to Pn according to the determined turn-on sequence.

Specifically, if the determination of Step S20 is YES, the control unit 20 increases the charging/discharging cycle number p by 1 in Step S90. For example, if the charging/discharging cycle number p is 1, p is increased to 2. If the charging/discharging cycle number is 2, it means the second charging/discharging. Step S100 proceeds after Step S90.

In Step S100, the control unit 20 determines the $p+1^{th}$ turn-on sequence of the first to $n^{th}$ switch units S1 to Sn in descending order from the switch unit having a greatest watt energy count value by referring to the first to $n^{th}$ watt energy count values recorded in the storage unit 30. Step S110 proceeds after Step S100.

The control unit 20 controls the turn-on operation of the first to $n^{th}$ switch units according to the $p+1^{th}$ turn-on sequence in Step S110. In Step S110, the control unit 20 performs the process of updating the first to $n^{th}$ watt energy count values according to the flowchart shown in FIG. 5, and the process proceeds to Step S60.

The control unit 20 controls the external switch unit M of the parallel multi battery pack MP to a turn-on state in Step S60. Then, the second charging or discharging of the parallel multi battery pack MP is initiated. Step S70 proceeds after Step S60.

The control unit 20 determines in Step S70 whether it is required to stop the second charging or discharging of the parallel multi battery pack MP. The request for stopping charging or discharging may be provided from the control system of the load L or the charger through a communication interface coupled to the control unit 20.

If the determination of Step S70 is NO, the control unit 20 maintains the turn-on state of the first to $n^{th}$ switch units S1 to Sn and the external switch unit M. Meanwhile, if the determination of Step S70 is YES, the control unit 20 turns off the external switch unit M and turns off the first to $n^{th}$ switch units S1 to Sn in Step S80 to stop charging or discharging of the parallel multi battery pack MP. The turn-off sequence of the first to $n^{th}$ switch units S1 to Sn is opposite to the turn-on sequence. After the second charging and discharging is ended, the process proceeds to Step S10. Therefore, the control unit 20 comes into a mode of monitoring whether a third charge or discharge request is provided from the control system of the load L or the charger.

The above control logic is repeated over and over again. That is, control unit 20 repeats the processes of increasing the charging/discharging cycle number by 1 (S90), determining the $p+1^{th}$ turn-on sequence for the first to $n^{th}$ switch units S1 to Sn by referring to the first to $n^{th}$ watt energy count values recorded in the storage unit 30 (S110), controlling the turn-on operation of the first to $n^{th}$ switch units S1 to Sn according to the determined $p+1^{th}$ turn-on sequence (S110) and simultaneously updating the first to $n^{th}$ watt energy count values (P10 to P120).

FIG. 6 is a table showing a watt energy count value consumed in the switch unit included in each battery pack based on $p^{th}$, $p+10^{th}$ and $p+20^{th}$ parallel connection timings when the switch unit included in the parallel multi battery pack MP where five battery packs are connected in parallel is controlled to turn on according to an embodiment of the present disclosure.

Referring to FIG. 6, in the $p^{th}$ parallel connection timing, parallel connection is made in the order of the fifth battery pack, the fourth battery pack, the third battery pack, the second battery pack and the first battery pack. In addition, at the $p+10^{th}$ parallel connection timing, parallel connection is made in the order of the second battery pack, the first battery pack, the third battery pack, the fifth battery pack and the fourth battery pack. In addition, at the $p+20^{th}$ parallel connection timing, connection is made in the order of the fifth battery pack, the fourth battery pack, the second battery pack, the first battery pack and the third battery pack.

According to the present disclosure, while a plurality of battery packs are being connected in parallel before charging or discharging of the parallel multi battery pack is initiated, it is possible to minimize damage to the switch units caused by an in-rush current by optimally controlling the turn-on operation sequence of the switch units included in the battery packs of the parallel multi battery pack. Therefore, it is possible to reduce the replacement cost caused by failure of the switch units by increasing the life of the switch units.

In the description of the various exemplary embodiments of the present disclosure, it should be understood that the element referred to as 'unit' is distinguished functionally rather than physically. Therefore, each element may be selectively integrated with other elements or each element may be divided into sub-elements for effective implementation control logic (s). However, it is obvious to those skilled in the art that, if functional identity can be acknowledged for the integrated or divided elements, the integrated or divided elements fall within the scope of the present disclosure.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

What is claimed is:

1. A turn-on operation control apparatus of a switch unit included in a parallel multi battery pack, which controls a turn-on operation of switches included in first to $n^{th}$ battery packs connected in parallel through a parallel link node, the turn-on operation control apparatus comprising:
   first to $n^{th}$ switches respectively installed on power lines of the first to $n^{th}$ battery packs;
   first to $n^{th}$ current sensors connected to the switches respectively installed on the power lines of the first to $n^{th}$ battery packs to measure currents flowing through the corresponding switches;

first to $n^{th}$ voltage sensors respectively coupled to the first to $n^{th}$ switches to measure both-end voltages of the corresponding switches; and a processor operatively coupled to the first to $n^{th}$ switches, the first to $n^{th}$ current sensors and the first to $n^{th}$ voltage sensors, wherein the processor is configured to:

connect the first to $n^{th}$ battery packs in parallel by turning on the first to $n^{th}$ switches according to a preset turn-on sequence before charging or discharging of the parallel multi battery pack is initiated, receive a switch voltage value from a voltage sensor coupled to a $k^{th}$ sequence switch (k is a turn-on sequence index, which is a natural number of 2 to n) before turning on the $k^{th}$ sequence switch, then turn on the $k^{th}$ sequence switch, subsequently receive a switch current value from a current sensor connected to the $k^{th}$ sequence switch, and count a watt energy value consumed in the $k^{th}$ sequence switch from the switch voltage value and the switch current value, and determine the turn-on sequence of the first to $n^{th}$ switches in descending order from a switch having a greatest watt energy count value by referring to watt energy count values respectively corresponding to the first to $n^{th}$ switches before charging or discharging of the parallel multi battery pack is initiated.

2. The turn-on operation control apparatus of the switch included in the parallel multi battery pack according to claim 1, wherein each of the first to $n^{th}$ switches includes a high-potential switch and a low-potential switch, and the processor is configured to receive a switch voltage value from a voltage sensor coupled to the high-potential switch included in the $k^{th}$ sequence switch (k is a turn-on sequence index, which is a natural number of 2 to n) before turning on the $k^{th}$ sequence switch, and then turn on the $k^{th}$ sequence switch.

3. The turn-on operation control apparatus of the switch included in the parallel multi battery pack according to claim 2, wherein the processor is configured to receive a switch current value from a current sensor connected to the high-potential switch included in the $k^{th}$ sequence switch, and count a watt energy value consumed in the $k^{th}$ sequence switch from the switch voltage value and the switch current value.

4. The turn-on operation control apparatus of the switch included in the parallel multi battery pack according to claim 1, further comprising:

a memory in which the switch voltage values and the switch current values of the first to $n^{th}$ switches and the watt energy count values consumed in the first to $n^{th}$ switches are recorded, wherein the processor is configured to determine the turn-on sequence of the first to $n^{th}$ switches in descending order from a switch having the greatest watt energy count value by referring to the watt energy count values respectively corresponding to the first to $n^{th}$ switches from the memory before charging or discharging of the parallel multi battery pack is initiated.

5. The turn-on operation control apparatus of the switch included in the parallel multi battery pack according to claim 3, further comprising:

a memory in which the switch voltage values of the high-potential switches respectively included in the first to $n^{th}$ switches, the switch current values flowing through the high-potential switches respectively included in the first to $n^{th}$ switches and the watt energy count values consumed in the first to $n^{th}$ switches are recorded, wherein the processor is configured to determine the turn-on sequence of the first to $n^{th}$ switches in descending order from a switch having the greatest watt energy count value by referring to the watt energy count values respectively corresponding to the first to $n^{th}$ switches before charging or discharging of the parallel multi battery pack is initiated.

6. The turn-on operation control apparatus of the switch included in the parallel multi battery pack according to claim 1, wherein the first to $n^{th}$ switches are relay switches.

7. A turn-on operation control method of a switch included in a parallel multi battery pack, which controls a turn-on operation of switches included in first to $n^{th}$ battery packs connected in parallel through a parallel link node, the turn-on operation control method comprising:

(a) providing first to $n^{th}$ switches respectively installed on power lines of the first to $n^{th}$ battery packs; first to $n^{th}$ current sensors connected to the switches respectively installed on the power lines of the first to $n^{th}$ battery packs to measure currents flowing through the corresponding switches; and first to $n^{th}$ voltage sensors respectively coupled to the first to $n^{th}$ switches to measure both-end voltages of the corresponding switches; and (b) connecting the first to $n^{th}$ battery packs in parallel by turning on the first to $n^{th}$ switches according to a preset turn-on sequence before charging or discharging of the parallel multi battery pack is initiated, receiving a switch voltage value from a voltage sensor coupled to a $k^{th}$ sequence switch (k is a turn-on sequence index, which is a natural number of 2 to n) before turning on the $k^{th}$ sequence switch, then turning on the kth sequence switch, subsequently receiving a switch current value from a current sensor connected to the $k^{th}$ sequence switch, and counting and storing a watt energy value consumed in the $k^{th}$ sequence switch from the switch voltage value and the switch current value, wherein the turn-on sequence of the first to $n^{th}$ switches is determined in descending order from a switch having a greatest watt energy count value by referring to watt energy count values respectively corresponding to the first to $n^{th}$ switches before charging or discharging of the parallel multi battery pack is initiated.

8. The turn-on operation control method of the switch included in the parallel multi battery pack according to claim 7, wherein each of the first to $n^{th}$ switches includes a high-potential switch and a low-potential switch, and in the step (b), a switch voltage value is received from a voltage sensor coupled to the high-potential switch included in the $k^{th}$ sequence switch (k is a turn-on sequence index, which is a natural number of 2 to n) before turning on the $k^{th}$ sequence switch, and then the $k^{th}$ sequence switch is turned on.

9. The turn-on operation control method of the switch included in the parallel multi battery pack according to claim 8, wherein in the step (b), a switch current value is received from a current sensor connected to the high-potential switch included in the $k^{th}$ sequence switch, and a watt energy value consumed in the $k^{th}$ sequence switch is counted based on the switch voltage value and the switch current value.

10. The turn-on operation control method of the switch included in the parallel multi battery pack according to claim 9, further comprising:

storing in memory the switch voltage values and the switch current values of the first to $n^{th}$ switches and the watt energy count values consumed in the first to $n^{th}$ switches, wherein in the step (b), the turn-on sequence of the first to $n^{th}$ switches is determined in descending order from a switch having the having a greatest watt energy count value by referring to the stored watt energy count values respectively corresponding to the first to $n^{th}$ switches before charging or discharging of the parallel multi battery pack is initiated.

11. The turn-on operation control method of the switch included in the parallel multi battery pack according to claim 9, further comprising:

storing in memory the switch voltage values of the high-potential switches respectively included in the first to $n^{th}$ switches, the switch current values flowing through the high-potential switches respectively included in the first to $n^{th}$ switches and the watt energy count values consumed in the first to $n^{th}$ switches, wherein in the step (b), the turn-on sequence of the first to $n^{th}$ switches is determined in descending order from a switch having the greatest watt energy count value by referring to the stored watt energy count values respectively corresponding to the first to $n^{th}$ switches before charging or discharging of the parallel multi battery pack is initiated.

12. The turn-on operation control method of switch included in the parallel multi battery pack according to claim 7, wherein the first to $n^{th}$ switches are relay switches.

13. A battery management system, comprising the turn-on operation control apparatus of the switch included in the parallel multi battery pack according to claim 1.

14. An electric driving mechanism, comprising the turn-on operation control apparatus of the switch included in the parallel multi battery pack according to claim 1.

* * * * *